United States Patent
Blumberg et al.

(10) Patent No.: US 7,830,142 B2
(45) Date of Patent: Nov. 9, 2010

(54) TUNING FORK MAGNETOMETER

(75) Inventors: Girsh Elias Blumberg, New Providence, NJ (US); Brian Scott Dennis, Chatham, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 975 days.

(21) Appl. No.: 11/474,831

(22) Filed: Jun. 26, 2006

(65) Prior Publication Data

US 2007/0296410 A1 Dec. 27, 2007

(51) Int. Cl.
G01R 33/02 (2006.01)

(52) U.S. Cl. .................................................... 324/244

(58) Field of Classification Search .............. 324/244, 324/242, 247, 253, 254, 255, 258, 228, 235, 324/259–262, 232; 361/143, 146, 147; 333/219.2; 33/361; 73/504.16, 514.31, 514.29
See application file for complete search history.

(56) References Cited

U.S. PATENT DOCUMENTS 3,506,897 A * 4/1970 Clifford ...................... 318/128
5,214,279 A * 5/1993 Hakamata ................... 250/234
5,698,784 A * 12/1997 Hotelling et al. .......... 73/504.16

OTHER PUBLICATIONS

R. D. Grober et al., "Fundamental limits to force detection using quartz tuning forks," Rev. Sci. Instrum., vol. 71, No. 7, pp. 2776-2780 (Jul. 2000).
Edmund Scientifics, "Samarium Cobalt (SmCo)," product pp. 1-2, found at URL http://scientificsonline.com and available or before Oct. 18, 2005.
C. A. Bolle et al., U.S. Appl. No. 11/250,123, filed Oct. 13, 2005.

* cited by examiner

Primary Examiner—Reena Aurora
(74) Attorney, Agent, or Firm—Michael J. Urbano

(57) ABSTRACT

Apparatus comprises a tuning fork having first and second tines, a first magnet disposed on the first tine, and a second magnet disposed on the second tine. In one embodiment the magnets comprise permanent magnets; in another they comprise electromagnets. In a preferred embodiment the magnets have magnetic moments oriented essentially parallel to the axis of the tines and anti-parallel to one another. In operation, the apparatus is made to oscillate at or near its resonant frequency, and in the presence of a magnetic field a parameter of the oscillation (e.g., its frequency, phase or amplitude) is altered in a fashion that allows the magnitude or direction of the magnetic field to be determined. In a preferred embodiment, the tuning fork is disposed within a vacuum enclosure, which increases the Q of the apparatus.

10 Claims, 5 Drawing Sheets

TUNING FORK MAGNETOMETER

BACKGROUND OF THE INVENTION

1. Field of the Invention

This invention relates to magnetic field detectors in general and to magnetometers that employ tuning forks in particular.

2. Discussion of the Related Art

The measurement of magnetic fields has many applications, such as navigating vessels, detecting magnetic metal in security settings, and prospecting for oil and minerals. In these settings there is a long-standing need for inexpensive, low-power apparatus to detect small changes in magnetic fields over large ranges. Existing apparatus are deficient in one or more of these desirable features.

For example, certain microelectromechanical (MEM) magnetometers measure changes in magnetic fields over only a small range of magnetic intensity. Thus, multiple magnetometers, each adjusted to a different range of magnetic field intensity, may be needed to cover a desired range. Also, some magnetometers respond nonlinearly to changes in the magnetic field intensity. Consequently, extensive and complex calibrations are needed to use these magnetometers. In other instances, components of magnetometers can become distorted when moving in response to a change in the magnetic field, thereby altering the physical or electrical response of the magnetometer itself. In still other cases, the fabrication of magnetometers is complex and expensive.

Similarly, other magnetometers like flux gate magnetometers or search coils require large size electrical coils to attain high sensitivities. They also require passing large currents through the coils during measurements, thereby consuming relatively large amounts of power.

Other magnetometers, such as superconducting quantum interference devices, are very sensitive magnetometers, but require cryogenic temperatures to operate. At room temperature, however, state-of-the-art magnetometers are sensitive to only a few tens of micro-Gauss (e.g., $30\text{-}70 \times 10^{-6}$ Gauss). Such magnetometers are commercially available from, e.g., Honeywell International Inc., Morristown, N.J. (See their website at www.ssec.honeywell.com.) Yet, many applications would benefit from even higher sensitivities at room temperature.

Thus, a need remains in the art for a highly sensitive magnetometer that operates at room temperature. For example, there is a need for a room temperature magnetometer that has a sensitivity of at least one micro-Gauss ($1 \times 10^{-6}$ Gauss).

BRIEF SUMMARY OF THE INVENTION

The need for high magnetic field sensitivity at room temperature is addressed in accordance with one aspect of our invention, apparatus comprising a tuning fork having first and second tines, a first magnet disposed on the first tine, and a second magnet disposed on the second tine. In one embodiment the magnets comprise permanent magnets; in another they comprise electromagnets. In a preferred embodiment the magnets have magnetic moments oriented essentially parallel to the axis of the tines and anti-parallel to one another.

In operation, the tuning fork is made to oscillate at or near its resonant frequency, and in the presence of a magnetic field, a parameter of the oscillation (e.g. its frequency, phase or amplitude) is altered in a fashion that allows the magnitude or direction of the magnetic field to be determined.

In a preferred embodiment, the tuning fork is disposed within a vacuum enclosure, which increases the Q of the apparatus.

In accordance with another aspect of our invention, a method comprises the steps of: (a) placing apparatus in a magnetic field, the apparatus including a tuning fork having first and second tines, a first magnet disposed on the first tine, and a second magnet disposed on the second tine, (b) causing the apparatus to oscillate at or near its resonant frequency, and (c) detecting magnetic-field-induced changes in a parameter of the oscillation.

BRIEF DESCRIPTION OF THE SEVERAL VIEWS OF THE DRAWING

Our invention, together with its various features and advantages, can be readily understood from the following more detailed description taken in conjunction with the accompanying drawing, in which.

DETAILED DESCRIPTION OF THE INVENTION

Figure 1:
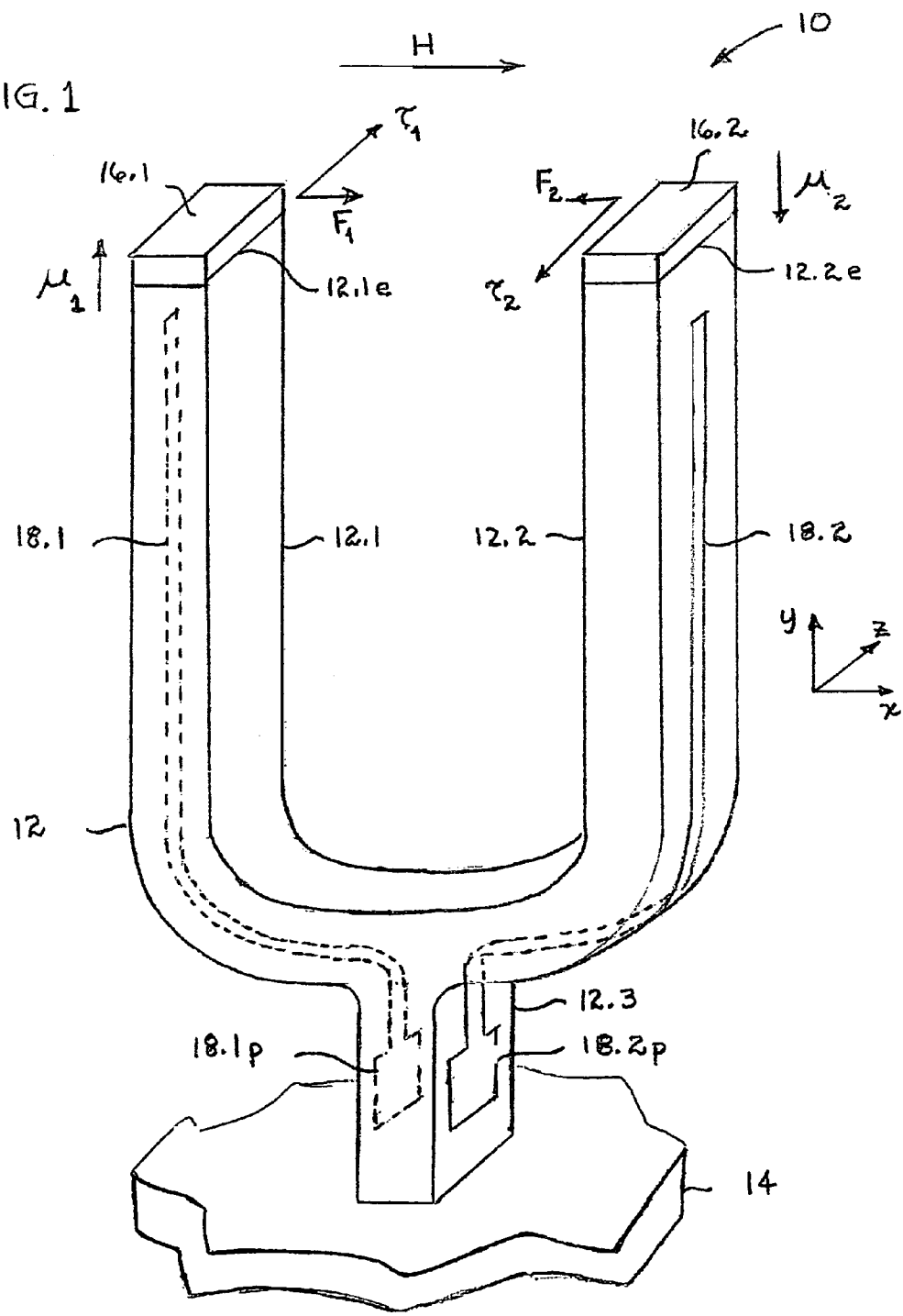
FIG. 1 is a schematic, isometric view of a magnetometer apparatus in accordance with one embodiment of our invention.

With reference now to FIG. 1, apparatus 10, when combined with a suitable drive circuit and detection subsystem discussed later, is configured to detect the magnitude and/or direction of a magnetic field H illustratively oriented in the +x-direction. Apparatus 10 is basically a loaded tuning fork; that is, apparatus 10 includes not only the tuning fork itself but also suitable electrodes and magnets affixed to the tuning fork. More specifically, apparatus 10 comprises a tuning fork 12, which includes a first tine 12.1 and a second tine 12.2 joined at a trunk 12.3. The latter is mounted on a support 14. Illustratively, tines 12.1 and 12.2 are oriented parallel to one another along the y-axis. In accordance with one aspect of our invention, a magnet 16.1 is disposed on the end surface (or tip) 12.1e of first tine 12.1, and a magnet 16.2 is disposed on the end surface (or tip) 12.2e of second tine 12.2. Magnets 16.1 and 16.2 exhibit magnet moments (e.g., dipoles) $\mu_1$ and $\mu_2$, respectively, which are oriented essentially parallel to the tines 12.1 and 12.2, respectively; that is, $\mu_1$ and $\mu_2$ are illustratively oriented essentially parallel to the y-axis. In addition, $\mu_1$ and $\mu^2$ are preferably oriented anti-parallel to one another; that is, $\mu_1$ is illustratively oriented in the +y-direction, whereas $\mu_2$ is illustratively oriented in the -y-direction.

Preferably magnets 16.1 and 16.2 are permanent magnets. Illustratively, they comprise a magnetic material such as iron or a rare-earth-based material (e.g., samarium cobalt), which has higher magnetic strength than iron. SmCo magnets are commercially available from Edmund Scientific of Tonawanda, N.Y. (See, the company's website, which can found on the internet at URL http://scientificsonline.com.) These magnets may be disposed on the end surfaces (or tips) of the tines 12.1 and 12.2 by means of a suitable adhesive. Alternatively, the magnetic material may be evaporated selectively onto the tine surfaces. Moreover, these magnets may be disposed on the side surfaces of the tines instead of (or in addition to) the end surfaces of the tines.

Typically tuning fork 12 comprises a piezoelectric material, illustratively quartz. In addition, tuning fork 12 is miniature device in which its tines are illustratively a few millimeters long and a fraction of a millimeter in cross-section. Such tuning forks typically have resonant frequencies of a few tens of kilohertz (e.g., $2^{15}$=32,768 Hz) and Q's of about 10,000-100,000. They are commercially available from Digi-Key Corporation of Thief River Falls, Minn. for example. (See, the company's website at URL http://www.digikey.com.)

In addition, apparatus 10 is made to oscillate at or near its resonant frequency. To this end, electrodes 18.1 and 18.2 extend along outer surfaces of tines 12.1 and 12.2, respectively, and terminate on opposite surfaces of trunk 12.3. Further to this end, a well-known drive circuit (not shown in FIG. 1; see 57 of FIG. 5 or 62 of FIG. 6) is coupled across electrodes 18.1 and 18.2 (e.g., across contact pads 18.1$p$ and 18.2$p$). The drive circuit applies an AC voltage, which causes the tines to deflect or bend; that is, they move toward and away from one another (e.g., in the ±x-direction) at or near the resonant frequency. Note, the resonant frequency of apparatus 10 (i.e., the tuning fork 12 and the electrodes 18.1 and 18.2 loaded with the magnets 16.1 and 16.1) is lower than that of the tuning fork with electrodes thereon. The amount by which the resonant frequency is lowered depends primarily on the mass of the magnets in accordance with well-known principles of physics and mechanics. Note further, the resonant frequency quoted by suppliers of commercially available piezoelectric tuning forks is typically that of the tuning fork with electrodes thereon.

In addition, although electrodes 18.1 and 18.2 are depicted as having the shape of relatively simple rectangles, in practice the electrodes on commercially available tuning forks typically have more complex shapes.

The presence of a magnetic field H also alters the operating frequency (e.g., its frequency, phase or amplitude) in the following fashion. The cross product of the vectors of the magnetic field H and the magnetic moment μ generates a torque τ. When the magnetic field (or a component thereof) is oriented in the x-direction and the magnetic moments are oriented in the ±y-direction, then anti-parallel torques $\tau_1$ and $\tau_2$ are generated in the ±z-directions. Associated with these torques $\tau_1$ and $\tau_2$ are forces $F_1$ and $F_2$, respectively, which are oriented in the ±x-directions. Thus, these forces either inhibit or enhance the bending of the tines, thereby altering the frequency at which the tines oscillate. Such changes in frequency, phase or amplitude of the oscillation are detected by means of a suitable detection subsystem well-known in the art, as discussed in greater detail in conjunction with FIG. 5. A subsystem for detecting changes in phase of the oscillation is shown in FIG. 6.

The source of the magnetic field H could be a planet's magnetic field or the magnetic field from a permanent magnet, temporary magnet or electromagnet.

In addition to sensing or measuring the absolute value of magnetic field intensity, our invention is also applicable to sensing or measuring changes in H. The change in magnetic field could be a change in intensity, direction or both. In some cases, the change in magnetic field H can be measured with a precision (or resolution) greater than about $1\times10^{-6}$ Gauss, for example, $1\times10^{-8}$ Gauss. The change in magnetic field H could be temporary, due, for example, to the movement of a magnetic-metal-containing object close to the apparatus 10. For example, when a magnetic-metal-containing object passes close to the apparatus 10, the earth's magnetic field is distorted in a manner that causes a change in the magnetic field H sensed by the apparatus 10. Alternatively, the change in the magnetic field could be due to a change in the magnetic properties of the source itself.

When our magnetometer is designed to have a high Q and a high resonant frequency (e.g., Q=80,000; $f_o$≈32 kHz), our calculations indicate that a miniature quartz tuning fork with iron permanent magnets can have a sensitivity of about $1\times10^{-8}$ Gauss at room temperature. Our calculations were predicated on four well-known equations:

$$\tau = r \times F \tag{1}$$

$$\tau = \mu \times H, \tag{2}$$

$$\mu = MV, \text{ and} \tag{3}$$

$$\delta F = [4k_B TK/\omega_o Q]^{0.5}, \tag{4}$$

where, equations (1), (2) and (3) are vector equations, bold face variables are vectors, equations (1) and (2) are vector cross products, τ=torque, r=the tip-to-trunk vector of each tine, F=force, μ=magnetic moment, M=magnetization, H=magnetic field, δF=the change in magnitude of the force F induced by the magnetic field, V=the volume of each magnet, $k_B$=Boltzmann's constant, T=temperature, K=the spring constant of the tuning fork (with electrodes thereon), $\omega_o = 2\pi f_o$=the resonant frequency of the tuning fork (as loaded by the magnets), and Q is the quality factor of the apparatus.

In comparison, since SmCo is a stronger magnet than iron, we expect that apparatus 10 with SmCo magnets 16.1 and 16.2 would have even better sensitivity.

Figure 5:
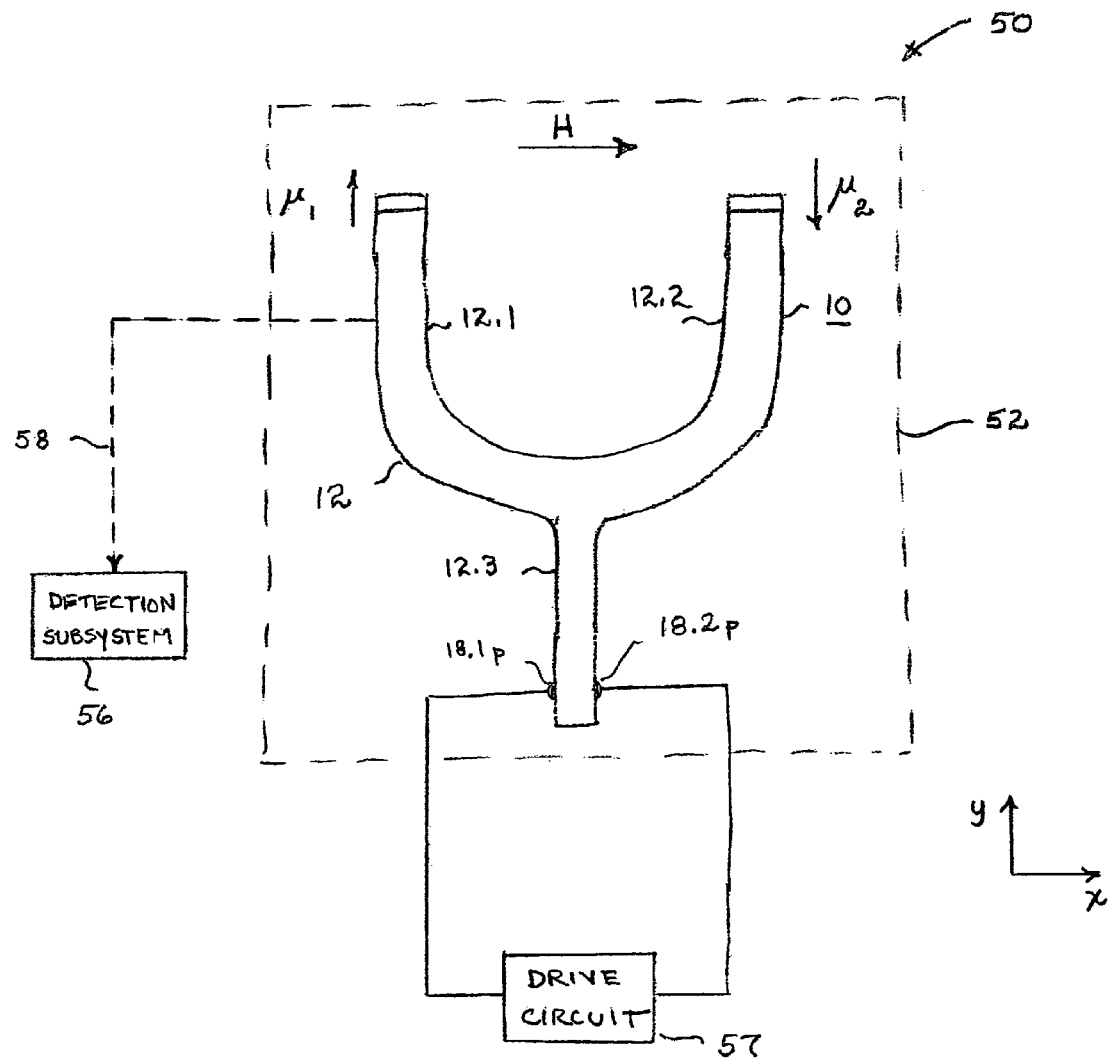
FIG. 5 is a schematic view of a magnetometer system in accordance with yet another embodiment of our invention.
Figure 6:
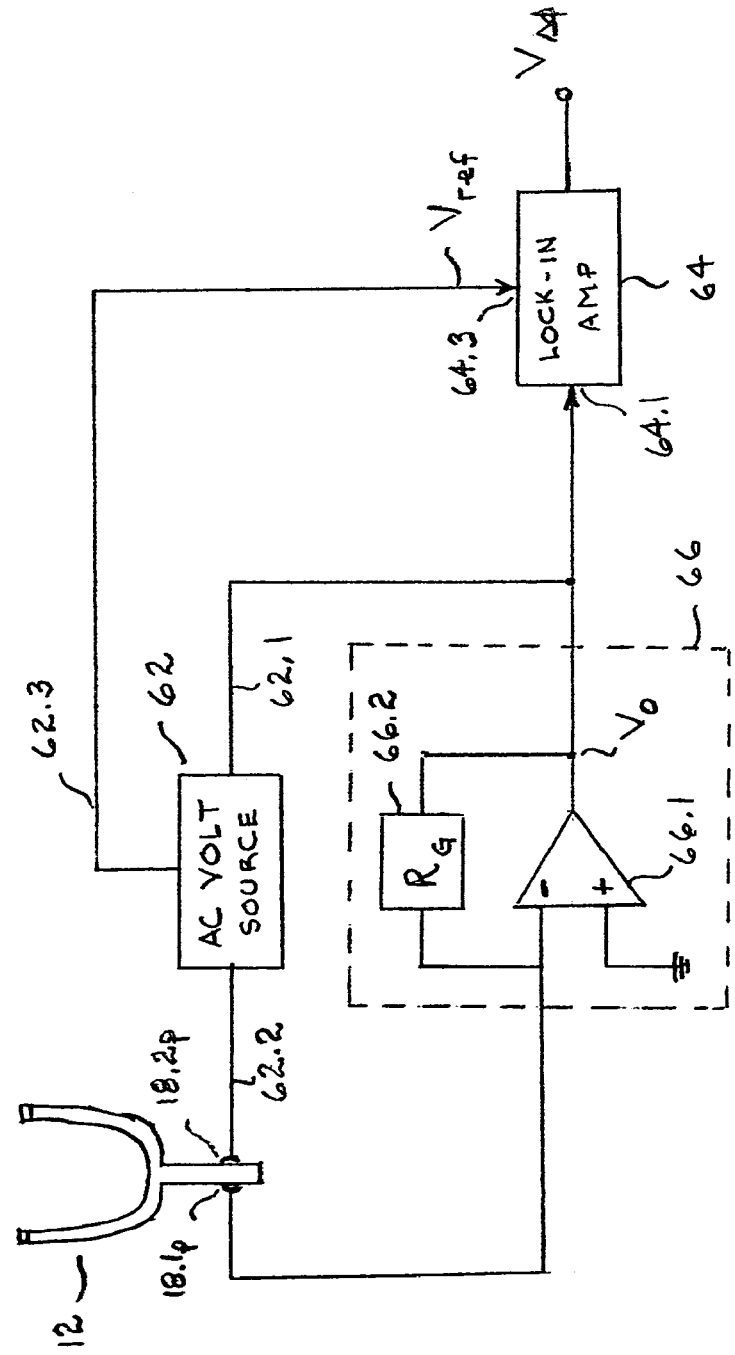
FIG. 6 is a circuit diagram of a combined drive circuit and detection system for use in conjunction with magnetometer apparatus in accordance with one more embodiment of our invention.

A magnetometer system 50 for exploiting such high sensitivity in accordance with another aspect of our invention is shown in FIG. 5. Here, apparatus 10 of the type depicted in FIG. 1 is disposed within a vacuum chamber 52, which reduces air friction and, therefore, has the effect of increasing the Q of the apparatus. (Q's of about 10,000 to 100,000 are typical.) Chamber 52 illustratively produces a vacuum of about 1-10 Torr.

In system 50 a drive circuit 57 and a detection subsystem 56 are coupled to apparatus 10 of the type previously described. Detection subsystem 56 is coupled to tuning fork 58 by a generalized link 58, which may be, for example, an electrical link, an optical link, or an electro-optical link. On the other hand, drive circuit 57, which is connected across contact pads 18.1$p$ and 18.2$p$ on the trunk 12.3 of piezoelectric tuning fork 12, supplies a voltage that produces lateral displacements (in the ±x-directions) of tines 12.1 and 12.2 at or near the resonant frequency of apparatus 10. By the term near we mean that the oscillation frequency of apparatus 10 is within the linewidth of the resonant frequency. Then, the interaction between the magnetic field H and the magnetic moments $\mu_1$ and $\mu_2$ affect the frequency, amplitude and/or phase of the tuning fork's oscillation by altering the impedance of the tuning fork 12. Changes in these characteristics of the oscillation appear in an electrical signal carried by conductors 18.1 and 18.2 (FIG. 1) and are measured by a suitable detection subsystem 56. For example, detection subsystem 56 may be an electronic system for detecting changes in phase of the operating frequency, as described by R. D. Grober et al., *Rev. Sci. Instrum.*, Vol. 71, No. 7, pp. 2776-2780 (2000), which is incorporated herein by reference and is discussed below in conjunction with the combined drive-detection system 60 of FIG. 6.

More specifically, the combined drive-detection system 60 includes an AC voltage source 62, which has voltage outputs 62.1 and 62.2 coupled to both the primary input 64.1 of lock-in amplifier 64 and the contact pad 18.2$p$ of tuning fork 12, respectively. In addition, source 62 also supplies a reference voltage $V_{ref}$ proportional to the phase of the AC voltage to reference input 64.3 of lock-in amplifier 64.

A current-to-voltage converter 66 is coupled between the contact pad 18.1$p$ and the primary input 64.1 of lock-in amplifier 64. Converter 66 includes an operational amplifier 66.1 having its negative input coupled to both contact pad 18.1$p$ and one side of resistor 66.2 ($R_G$); its positive input is grounded. The other side of resistor 66.2 is coupled to the output $V_o$ of amplifier 66.1, which in turn is coupled to the primary input 64.1 of lock-in amplifier 64. The output voltage $V_{\Delta\phi}$ of lock-in amplifier 64 is proportional to the changes in phase of the oscillation of the loaded tuning fork 12.

Alternatively, the detection system 56 may be an electro-optic system (not shown) in which a reflector is disposed on one of the tines, a laser beam is bounced off the reflector, and the reflected signal is detected by a position detector (e.g., by an array of photodiodes). The detection system converts the position that the beam strikes the array into the corresponding oscillation frequency. The latter is related to the forces $F_1$ and $F_2$ applied to the tines and hence to the strength of the magnetic field H.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

Figure 2:
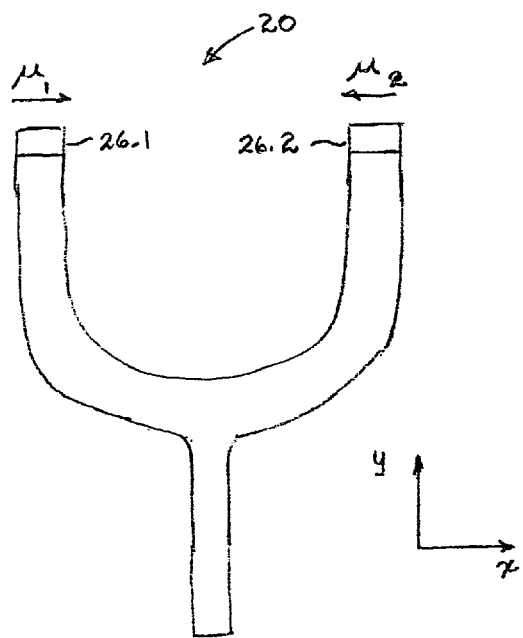
FIG. 2 is a schematic, side view of a magnetometer apparatus in accordance with another embodiment of our invention.
Figure 3:
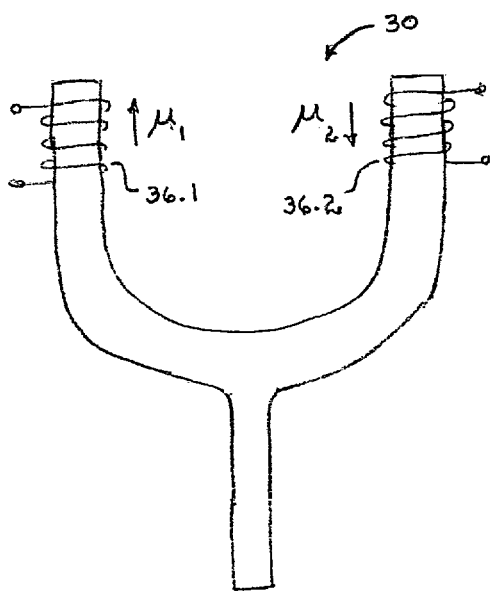
FIG. 3 is a schematic, side view of a magnetometer apparatus in accordance with one more embodiment of our invention.

In particular, as shown in apparatus 20 of FIG. 2, the permanent magnets 26.1 and 26.2 may produce magnetic moments that are oriented in the x-z plane instead of the ±y-direction, but this embodiment may not be preferred since the apparatus 20 has less sensitivity than the apparatus 10 of FIG. 1. Alternatively, as shown in the apparatus 30 of FIG. 3, the magnets may be electromagnets 36.1 and 36.2 rather than permanent magnets, but this embodiment may also not be preferred because of the additional complexity of forming such magnets on the tines and the need for additional power to drive them.

Figure 4:
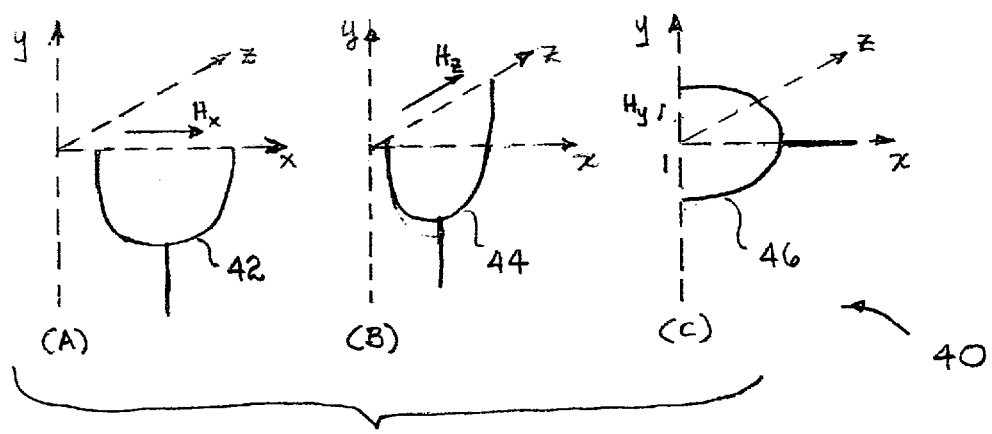
FIG. 4 is a schematic view of magnetometer apparatus that includes an array of, for example, three tuning fork magnetometers in accordance with still another embodiment of our invention.

Finally, different magnetic field directions can be sensed by rotating the tuning fork, which requires a suitable form of mechanical actuator, or by using a plurality of tuning forks oriented along three orthogonal directions. An embodiment of the latter arrangement is shown in FIG. 4. Here, tuning fork 42 is oriented along the x-axis to detect magnetic field component $H_x$, tuning fork 44 is oriented along the z-axis to detect magnetic field component $H_z$, and tuning fork 46 is oriented along the y-axis to detect magnetic field component $H_y$. By using straightforward vector analysis, the overall H vector (i.e., its magnitude and direction) can be readily reconstructed from these three components. Note, although we have depicted the trunk 42.2 of the tuning fork 42 in FIG. 4A as extending along the y-axis, that orientation is not essential. In fact, as long as the magnetic field H (or a component thereof) is directed along the imaginary line 42.1 joining the tips of the tines, and as long as $\mu_1$ and $\mu_2$ are perpendicular to H, then it does not matter how the trunk 42.2 is oriented; that is, the trunk 42.2 can be oriented anywhere is the 360° of its rotation around the imaginary line 42.1. Similar comments apply to FIGS. 4B & 4C, as well as FIGS. 1, 2, 3 & 5.

Figure 7:
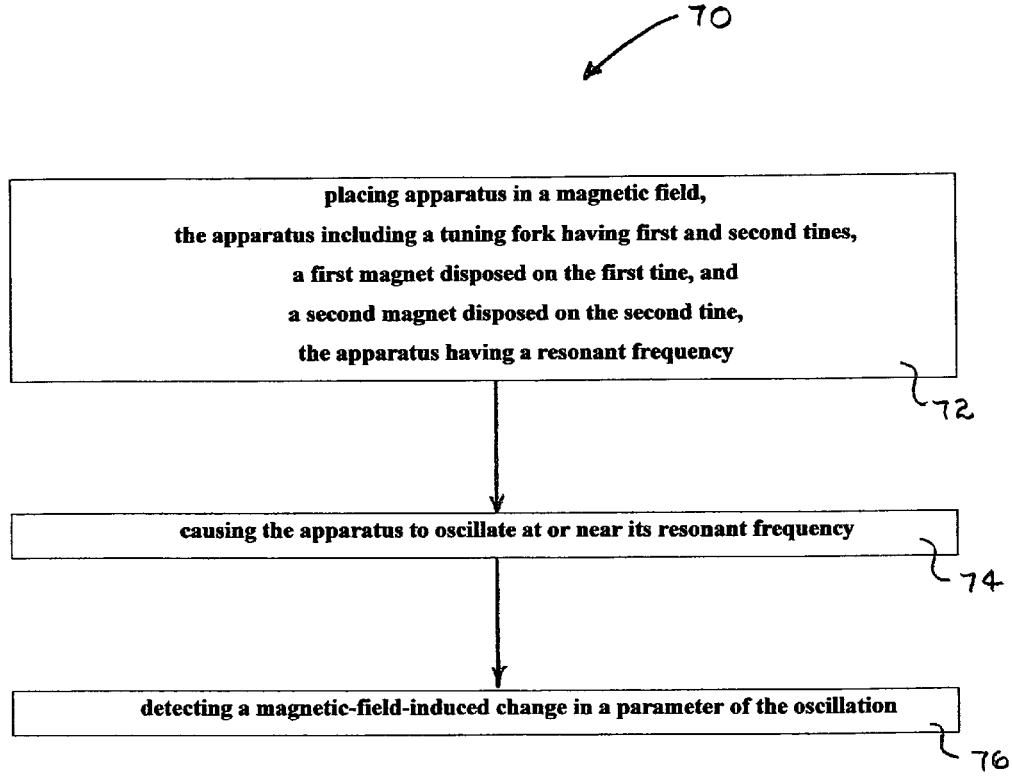
FIG. 7 is a flow chart describing the principle steps of a method in accordance with another aspect of our invention.

In accordance with another aspect of our invention, as shown in the flow chart of FIG. 7, a method 70 comprises the following steps: step 72—placing apparatus in a magnetic field, the apparatus including a tuning fork having first and second tines, a first magnet disposed on the first tine, and a second magnet disposed on the second tine, as shown in FIGS. 1-4, for example; step 74—causing the apparatus to oscillate at or near its resonant frequency; and step 76—detecting magnetic-field-induced changes in a parameter of the oscillation. Step 76 may include, for example, detecting changes in the frequency, phase or amplitude of the oscillation. Moreover, step 76 may involve detecting the changes in a variety of ways; e.g., electronically, optically, or electro-optically.

We Claim:

1. Apparatus comprising:
   a tuning fork having first and second tines,
   a first magnet disposed on said first tine, and
   a second magnet disposed on said second tine,
   wherein said magnets have anti-parallel magnetic moments, said tines are elongated in a particular direction, and said anti-parallel magnetic moments are oriented essentially along said direction.

2. The apparatus of claim 1, wherein said magnets comprise permanent magnets.

3. The apparatus of claim 1, wherein said magnets comprise electromagnets.

4. Apparatus comprising at least two apparatuses accordingly to claim 1, the tuning fork of one of said apparatuses being oriented so that a line through the tips of its tines is essentially perpendicular to the corresponding line of the tuning fork of another of said apparatuses.

5. The apparatus of claim 1, further including
   a drive circuit for causing said apparatus to oscillate at or near its resonant frequency; and
   a detection system of sensing changes in a parameter of said oscillation induced by the presence of a magnetic field.

6. The apparatus of claim 1, further including a vacuum enclosure, said apparatus being disposed within said enclosure.

7. The apparatus of claim 1, wherein said tuning fork comprises a piezoelectric material.

8. A magnetometer comprising:
   a vacuum enclosure,
   apparatus having a resonant frequency, said apparatus being disposed within said enclosure and including
      a piezoelectric tuning fork having first and second tines, each of said tines having a surface on a free end thereof,
      a first permanent magnet disposed on said free end surface of said first tine,
      a second permanent magnet disposed on said free end surface of said second tine;
      said tines being elongated in a particular direction and said magnets having anti-parallel magnetic moments that are oriented essentially along said direction,
   a drive circuit for causing said apparatus to oscillate at or near said resonant frequency,
   a detection system of sensing magnetic-field-induced changes in the frequency, amplitude or phase of said oscillation caused by the presence of a magnetic field having at least a component oriented parallel to the imaginary line joining the ends of said tines.

9. A method comprising the steps of:
locating apparatus in a magnetic field, the apparatus including a tuning fork having first and second tines, a first magnet disposed on the first tine, and a second magnet disposed on the second tine, Wherein said magnets have anti-parallel magnetic moments, said lines are elongated in a particular direction, and said anti-parallel magnetic moments are oriented essentially along said direction,
causing the apparatus to oscillate at or near its resonant frequency, and
detecting magnetic-field-induced changes in a parameter of the oscillation.

10. The method of claim 9, wherein the detecting step includes sensing changes in the frequency, phase or amplitude of the oscillation.

* * * * *